US010739380B2

(12) United States Patent
Wen et al.

(10) Patent No.: US 10,739,380 B2
(45) Date of Patent: Aug. 11, 2020

(54) MULTILEVEL TRIGGERING SYSTEM FOR OUTPUTTING COMPLEX TRIGGER SIGNAL

(71) Applicant: Keysight Technologies, Inc., Santa Rosa, CA (US)

(72) Inventors: Zhu Wen, Beijing (CN); Yu Zuo, Beijing (CN); Hong-Wei Kong, Beijing (CN)

(73) Assignee: Keysight Technologies, Inc., Santa Rosa, CA (US)

( * ) Notice: Subject to any disclaimer, the term of this patent is extended or adjusted under 35 U.S.C. 154(b) by 2050 days.

(21) Appl. No.: 13/947,210

(22) Filed: Jul. 22, 2013

(65) Prior Publication Data

US 2014/0058692 A1    Feb. 27, 2014

(30) Foreign Application Priority Data

Aug. 21, 2012  (CN) .......................... 2012 1 0307801

(51) Int. Cl.
*G01R 1/00* (2006.01)
*G01R 13/02* (2006.01)

(52) U.S. Cl.
CPC ........... *G01R 1/00* (2013.01); *G01R 13/0254* (2013.01)

(58) Field of Classification Search
CPC .......... G05B 2219/15057; G05B 11/01; G01R 13/0254; G01R 31/3177; G06F 17/5009; G06F 11/3636

(Continued)

(56) References Cited

U.S. PATENT DOCUMENTS 5,754,823 A * 5/1998 Mudryk, Jr. ......... G05B 19/045
                                                          326/125
6,107,821 A * 8/2000 Kelem ............. H03K 19/17752
                                                          326/38

(Continued)

FOREIGN PATENT DOCUMENTS

CN          1667545 A      9/2005

OTHER PUBLICATIONS

Search Report dated May 14, 2014 in German Application No. DE 10 2013 213 914.14.

(Continued)

*Primary Examiner* — Alexander Satanovsky
*Assistant Examiner* — Jeffrey P Aiello (57) ABSTRACT

A multilevel triggering system of a signal analysis instrument outputs a complex trigger signal. The triggering system includes a trigger controlled buffer for receiving and buffering an input signal, triggering function modules, and a triggering matrix. Each triggering function module performs a corresponding triggering function for detecting a corresponding triggering condition. The triggering matrix includes multiple triggering levels, each of which is configurable to include at least one trigger block and each trigger block being configurable to implement one of the triggering function modules. Each trigger block generates a corresponding block trigger when the triggering condition of the corresponding triggering function module is detected in the buffered input signal. Each triggering level generates a corresponding level trigger when the at least one trigger block in the triggering level generates the corresponding block trigger, and the triggering matrix generates the complex trigger signal when the triggering levels generate corresponding level triggers.

20 Claims, 5 Drawing Sheets

(58) Field of Classification Search
USPC .............. 702/66, 183; 714/E11.155, 45
See application file for complete search history.

(56) References Cited

U.S. PATENT DOCUMENTS

| | | | |
|---|---|---|---|
| 6,615,148 B2 | 9/2003 | Pickerd | |
| 6,760,574 B1* | 7/2004 | Lu .................... | H04L 7/0054 375/354 |
| 7,612,597 B2 | 11/2009 | Matsumoto | |
| 2002/0147554 A1* | 10/2002 | Pickerd .............. | G01R 13/345 702/66 |
| 2004/0025122 A1* | 2/2004 | Schubert ............. | G06F 17/504 716/106 |
| 2006/0079970 A1* | 4/2006 | Ward .................. | G05B 19/056 700/86 |
| 2009/0281759 A1 | 11/2009 | Cake et al. | |
| 2010/0076715 A1* | 3/2010 | Yu ....................... | G06F 11/263 702/120 |
| 2010/0228918 A1* | 9/2010 | Vorbach .............. | G06F 8/433 711/118 |
| 2011/0137594 A1 | 6/2011 | Sullivan et al. | |
| 2012/0265322 A1* | 10/2012 | Hildebran ............ | G05B 19/056 700/9 |

OTHER PUBLICATIONS

"Protocol Analyzer TPI4000 Series Data Sheet", Tektronix Inc., www.tektronix.com, pp. 1-12.
Chinese Office Action dated Jun. 27, 2017 with English Translation.
Chinese Search Report dated Jun. 16, 2017 with English Translation.
Chinese Office Action dated Feb. 24, 2018 with English Translation, 6 pgs.
Chinese Office Action dated Jun. 21, 2018 with English Translation, 6 pgs.
Notification of Reexamination dated Jun. 18, 2019 with English Translation, 6 pgs.

\* cited by examiner

Prior Art

MULTILEVEL TRIGGERING SYSTEM FOR OUTPUTTING COMPLEX TRIGGER SIGNAL

CROSS-REFERENCE TO RELATED APPLICATIONS

This application claims priority under 35 U.S.C. § 119(a) from Chinese Patent Application No. 201210307801.3, filed Aug. 21, 2012, the subject matter of which is hereby incorporated by reference.

BACKGROUND

Conventional signal analysis instruments, such as spectrum analyzers, oscilloscopes and the like, use triggering systems in order to trigger data capture of an input signal of interest for analysis by a user. However, more signal analysis applications require complicated triggering capability to detect transient or complex input signals, which conventional triggering systems cannot satisfy.

More particularly, a conventional triggering system has a signal level architecture. That is, there are different triggering blocks in the triggering system, and each triggering block detects a specified feature of the input signal, such as power level, spectrum shape, and the like. The input signal passes through only one of the triggering blocks to generate the corresponding trigger signal, so only one triggering condition can be used to detect the signal.

Figure 1:
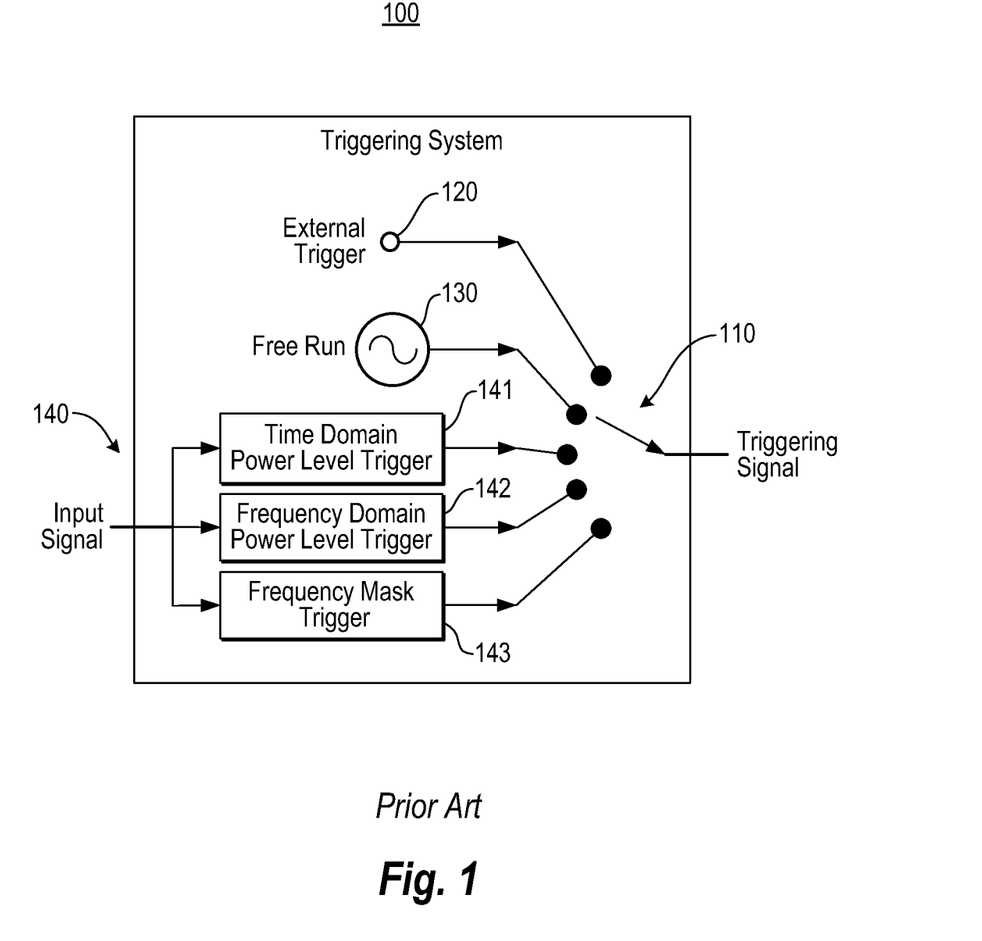
FIG. 1 is a block diagram illustrating a conventional triggering system of spectrum analyzer.

FIG. 1 is a block diagram illustrating a conventional triggering system of spectrum analyzer. Referring to FIG. 1, triggering system 100 receives an input signal and provides a trigger signal based on only one triggering function, selectable by switch 110. The trigger signal may be generated in response to External Trigger 120, which may be activated by the user, for example. No trigger signal will be generated in response to Free Run 130, which does not consider any trigger conditions and enables the input signal to pass through the triggering system. Alternatively, the trigger signal may be generated in response to a selected one of multiple trigger blocks 141 to 143 in trigger block set 140, each of which is configured to detect a corresponding trigger condition in the input signal. For example, trigger block 141 provides a time domain power level trigger, trigger block 142 provides a frequency domain power level trigger, and trigger block 143 provides a frequency mask trigger. However, as mentioned above, only one trigger may be selected at a time as the trigger signal. Further, the trigger blocks 141-143 may be predetermined, in that the user has a limited choice of corresponding functionalities.

Notably, some conventional triggering systems are able to implement more than one trigger (e.g., via multiple trigger blocks) with regard to an input signal. However, the trigger blocks are sequentially arranged, such that the input signal passes through all of the trigger blocks and a trigger signal is ultimately generated only once all of the corresponding trigger conditions are detected.

Thus, a disadvantage of conventional triggering systems is lack of flexibility. In contrast, in many signal analysis applications, the user would like to generate triggers based on complicated triggering conditions (for example, need to detect pulse signal with specified pulse duration and spectrum shape simultaneously), which cannot be resolved by a conventional single level triggering system. Also, even when multiple trigger blocks are available, the desired types and arrangements of various triggering conditions may not be accommodated, thus the conventional multiple level triggering system is likewise insufficient.

SUMMARY

In a representative embodiment, a multilevel triggering system of a signal analysis instrument for outputting a complex trigger signal includes a trigger controlled buffer configured to receive and buffer an input signal, multiple triggering function modules, and a triggering matrix. Each triggering function module being configured to perform a corresponding triggering function for detecting a corresponding triggering condition. The triggering matrix includes multiple triggering levels, each of which is configurable to include at least one trigger block and each trigger block being configurable to implement one of the triggering function modules. Each trigger block generating a corresponding block trigger when the triggering condition of the corresponding triggering function module is detected in the buffered input signal. Each triggering level is configured to generate a corresponding level trigger when the at least one trigger block in the triggering level generates the corresponding block trigger, and the triggering matrix is configured to generate the complex trigger signal when the triggering levels generate corresponding level triggers.

In another representative embodiment, a computer readable medium is provided for storing software, executable by a processor, for multilevel triggering of a signal analysis instrument to output a complex trigger signal. The computer readable medium includes first level code including multiple first trigger blocks configurable to implement corresponding different triggering function modules for implementing different trigger functions responsive to corresponding triggering conditions, each first trigger block generating a corresponding first block trigger when the triggering conditions of the triggering function modules are detected in a first portion of an input signal The first level code generates a corresponding first level trigger in accordance with a first logical expression incorporating the corresponding first block triggers generated by the first trigger blocks, respectively. The computer readable medium further includes second level code including multiple second trigger blocks configurable to implement corresponding different triggering function modules for implementing different trigger functions responsive to corresponding triggering conditions, each second trigger block generating a corresponding second block trigger when the triggering conditions of the triggering function modules are detected in a second portion of the input signal. The second level code generates a corresponding second level trigger in accordance with a second logical expression incorporating the corresponding second block triggers generated by the second trigger blocks, respectively. The complex trigger signal is generated when the first and second level codes generate corresponding first and second level triggers, respectively.

In another representative embodiment, a signal analysis instrument includes a radio frequency (RF) downconverter configured to receive an RF input signal, e.g., from a test device, and to provide a downconverted analog input signal, an analog to digital converter (ADC) configured to convert the analog signal to a digital input signal, and a multilevel triggering system configured to receive the digital input signal and to selectively output a complex trigger signal based on characteristics of the input signal, and a signal processing system. The multilevel triggering system includes a trigger controlled buffer, a trigger block library, and a triggering matrix. The trigger controlled buffer is configured to buffer the digital input signal and to selectively output a detected signal in response to the complex trigger signal. The trigger block library is configured to store multiple triggering function modules, each triggering function module being configured to perform a corresponding triggering function for detecting a corresponding triggering condition. The triggering matrix includes multiple triggering levels, each triggering level being configurable to include at least one trigger block and each trigger block being configurable to implement one of the triggering function modules from the trigger block library. Each trigger block generates a corresponding block trigger when the triggering condition of the corresponding triggering function module is detected in the buffered input signal. The signal processing system is configured to control the triggering system and to analyze the digital input signal in response to the complex trigger signal selectively output by the triggering system. Each triggering level is configured to generate a corresponding level trigger when the at least one trigger block in the triggering level generates the corresponding block trigger. The triggering matrix is configured to generate the complex trigger signal when the triggering levels generate corresponding level triggers.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

According to various embodiments, a triggering system of a signal analysis instrument has multilevel architecture, which is able to apply multiple complicated triggering conditions (e.g., according to logical expressions) for detection of the input signal. The architecture of the triggering system may be configurable by users based on different triggering requirements, providing flexibility for the detection. Also, the triggering system may be configured such that the various triggering levels receive the input signal only when the triggering conditions of one or more preceding triggering levels are satisfied, reducing computation time and increasing overall efficiency of the signal analysis instrument.

Figure 2:
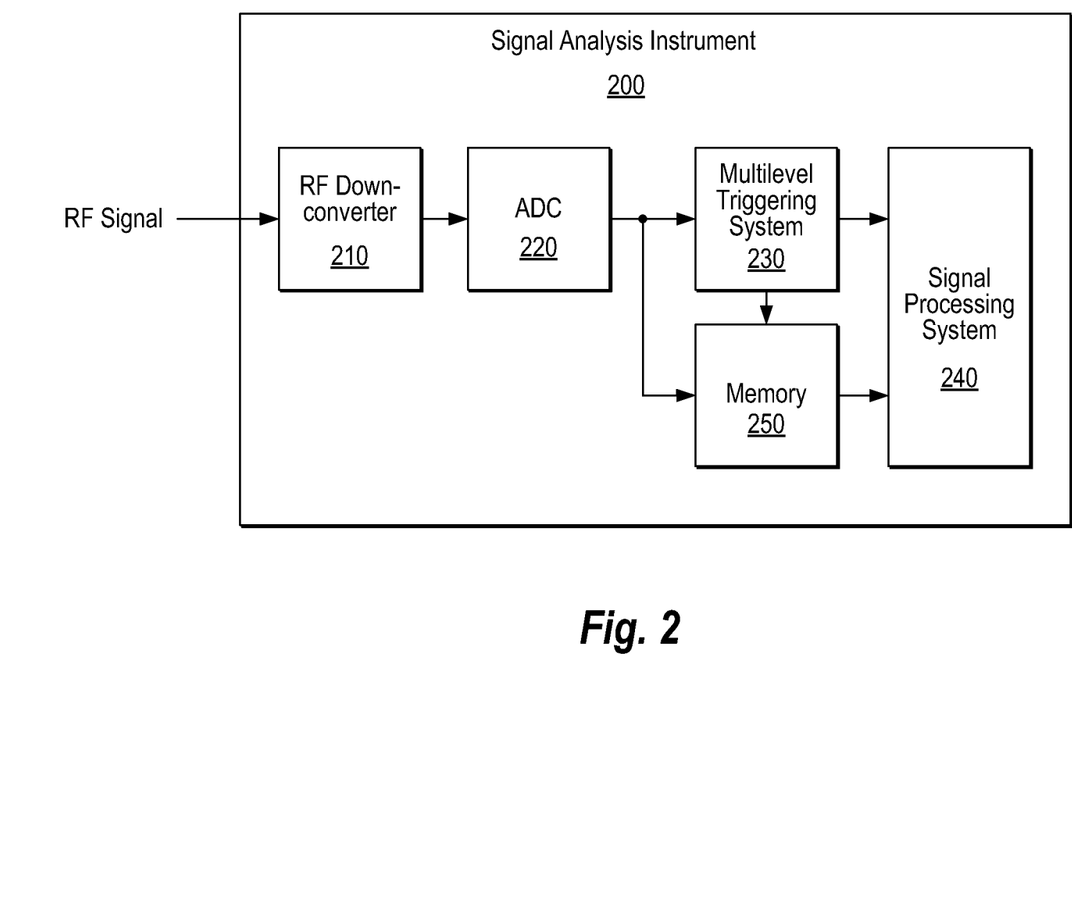
FIG. 2 is a block diagram of a signal analysis instrument including a multilevel triggering system, according to a representative embodiment.

FIG. 2 is a block diagram of a signal analysis instrument including a multilevel triggering system, according to a representative embodiment.

Referring to FIG. 2, signal analysis instrument 200 receives and analyzes an input signal by detecting multiple triggering conditions in accordance with multiple triggers arranged in various triggering levels. The signal analysis instrument 200 may be a spectrum analyzer or an oscilloscope, for example, configured to receive and analyze an input signal (test signal) from a device under test. The signal analysis instrument 200 includes radio frequency (RF) downconverter 210 and analog-to-digital converter (ADC) 220. Generally, the RF downconverter 210 receives an RF input signal and removes the RF carrier from the input signal, for example, using a local oscillator (not shown). The ADC 220 converts the analog input signal to a digital input signal, as would be apparent to one of ordinary skill in the art.

The signal analysis instrument 200 further includes multilevel triggering system 230, signal processing system 240 and memory 250. The multilevel triggering system 230 receives the digital input signal from the ADC 220, and performs a complex triggering function on the digital input signal by combining multiple discrete triggering functions (effectively implementing one or more logical expressions) for detecting corresponding triggering conditions. The multilevel triggering system 230 generates a complex trigger signal when the triggering conditions of the complex triggering function are detected, and outputs the complex trigger signal to the signal processing system 240 (and the memory 250) in order to trigger data capture of the digital input signal. Also, in response to the complex trigger signal, the multilevel triggering system 230 provides the detected input signal to the signal processing system 240 and the memory 250. The signal processing system 240 is therefore able to process and analyze the detected input signal at the point at which the input signal exhibits the triggering conditions. The multilevel triggering system 230 is discussed in greater detail with reference to FIGS. 3 and 4, below.

The signal processing system 240 may be implemented by a computer processor, application specific integrated circuits (ASICs), field-programmable gate arrays (FPGAs), or combinations thereof, using software, firmware, hard-wired logic circuits, or combinations thereof. When using a computer processor, a memory may be included, such as a non-transitory computer readable medium, for storing executable software/firmware and/or executable code that allows it to perform the various functions. The memory may include any number, type and combination of random access memory (RAM) and read-only memory (ROM), for example. In an embodiment, the signal processing system 240 is configured to analyze a detected signal (data capture) output by the multilevel triggering system 230 (e.g., via trigger controlled buffer 310, discussed below) in response to the complex trigger signal.

The memory 250 may store the detected input signal and/or complex trigger signals output by the multilevel triggering system 230, as well as processing and analysis results generated by the signal processing system 240. The memory 250 may include any number, type and combination of RAM and ROM, and may provide look-up tables and/or other relational functionality. In various embodiments, the memory 250 may include a flash memory or a disk drive, for example, although other types of memory may be incorporated without departing from the scope of the present teachings.

Figure 3:
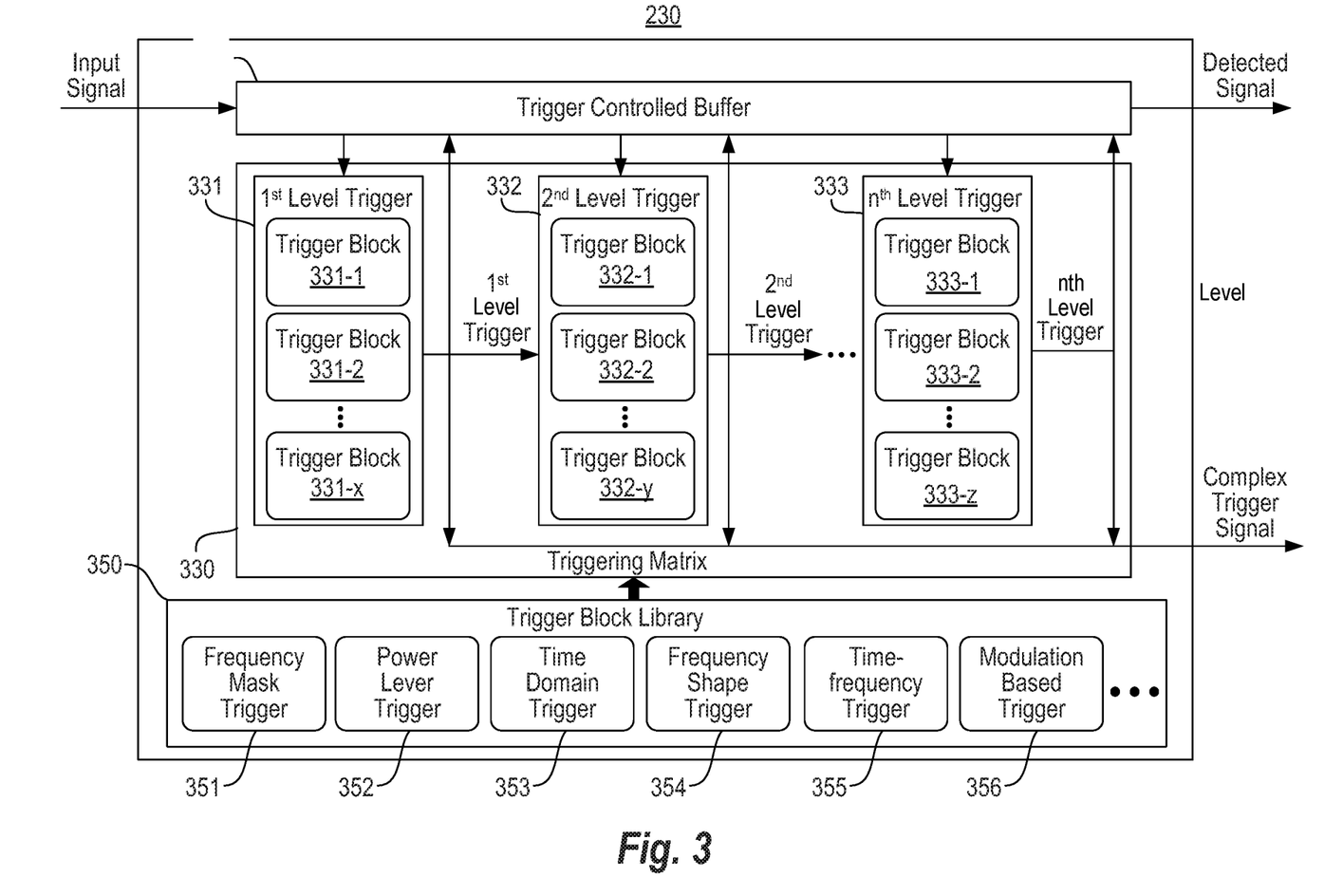
FIG. 3 is a block diagram of a multilevel triggering system, according to a representative embodiment.

FIG. 3 is a block diagram of a multilevel triggering system, according to a representative embodiment.

Referring to FIG. 3, multilevel triggering system 230 is configured to output a complex trigger signal. In the depicted embodiment, the multilevel triggering system 230 includes a trigger controlled buffer 310, triggering matrix 330, and a trigger block library 350. The trigger controlled buffer 310 is configured to receive and buffer the digital input signal, for example, received from the ADC 220. The trigger controlled buffer 310 continues to buffer the digital input signal until the complex trigger signal is generated by the triggering matrix 330, at which point the trigger controlled buffer 310 outputs the detected input signal to the signal processing system 240 and/or the memory 250. For example, the trigger controlled buffer 310 may be a first-in first-out (FIFO) buffer that stores the input signal until sent to the triggering matrix 330. In various embodiments, the trigger controlled buffer 310 selectively provides the digital input signal to the different triggering levels (e.g., first through $n^{th}$ triggering levels 331 to 333 of the triggering matrix 330), as further discussed below. This assures that the triggering levels receive the digital input signal (or different portions of the digital input signal) and attempt to detect corresponding trigger conditions only as needed, thus reducing the processing requirements of the multilevel triggering system 230.

The triggering matrix 330 includes multiple triggering levels, indicated by representative first triggering level 331, second triggering level 332, through $n^{th}$ triggering level 333. Of course, more of fewer triggering levels may be included, without departing from the scope of the present teachings. Each of the first through $n^{th}$ triggering levels 331 to 333 is configurable to include one or more trigger blocks. For example, the first triggering level 331 may include trigger blocks 331-1, 331-2, . . . 331-x, the second triggering level 332 may include trigger blocks 332-1, 332-2, . . . 332-y, and the $n^{th}$ triggering level 333 may include trigger blocks 333-1, 333-2, . . . 333-z. Also, the first through $n^{th}$ triggering levels 331 to 333 generate corresponding first through $n^{th}$ level triggers, respectively, based on triggering conditions of the corresponding trigger blocks 331-1 to 331-x, 332-1 to 332-y, and 333-1 to 333-z, as discussed below. Notably, although three trigger blocks are depicted in each for purposes of illustration, it is understood that the first through $n^{th}$ triggering levels 331 to 333 may have different numbers of trigger blocks from one another, and likewise may have more or fewer than three trigger blocks (including just one trigger block), depending on the desired triggering conditions for generating the corresponding first through $n^{th}$ level triggers, as discussed below. In various embodiments, the triggering matrix 330 generates and outputs the complex trigger signal when all of the first through $n^{th}$ level triggers have been generated.

Each of the trigger blocks 331-1 to 331-x, 332-1 to 332-y, and 333-1 to 333-z is configurable to implement a corresponding triggering function module, and to generate a corresponding block trigger when the triggering condition of the corresponding triggering function module is detected (e.g., in the input signal provided by the trigger controlled buffer 310). The triggering function modules are previously built software modules, for example, configured to perform corresponding triggering functions for detecting corresponding triggering conditions, respectively. In the depicted embodiment, the triggering function modules are stored in the trigger block library 350, as indicated by representative triggering function modules 351 to 356. For example, triggering function module 351 may perform a frequency mask triggering function, triggering function module 352 may perform a power level triggering function, triggering function module 353 may perform a time domain triggering function, triggering function module 354 may perform a frequency shape triggering function, triggering function module 355 may perform a time-frequency triggering function, and triggering function module 356 may perform a modulation based triggering function. Of course, the number and type of triggering functions may vary without departing from the scope of the present teachings.

The same triggering function module 351 to 356 may be used to populate trigger blocks in one or more of the first through $n^{th}$ triggering levels 331 to 333, and/or may be repeated within the same triggering level 331 to 333. Also, the triggering function modules 351 to 356 have uniform input and output interfaces, enabling them to receive input signals from the trigger controlled buffer 310 and to output corresponding triggers. In various embodiments, at least one parameter of the triggering condition of each of the triggering function modules 351 to 356 may be configured by the user.

The trigger block library 350 is accessible by the triggering matrix 330, enabling the user to populate the trigger blocks 331-1 to 331-x, 332-1 to 332-y, and 333-1 to 333-z of the triggering levels 331 to 333 with the various trigger function modules 351 to 356. In the depicted embodiment, the trigger block library 350 is included in the multilevel triggering system 230, although in alternative configurations, all or part of the trigger block library 350 may be included in the memory 250 and/or the signal processing system 240, accessible by the triggering matrix 330. The triggering function modules 351 to 356 are configured to cause the trigger blocks 331-1 to 331-x, 332-1 to 332-y, and 333-1 to 333-z, which they respectively populate, to generate block triggers when the corresponding triggering conditions are detected.

As mentioned above, the trigger controlled buffer 310 may be configured to selectively provide the digital input signal to just one triggering level (e.g., first through $n^{th}$ triggering levels 331-333 of the triggering matrix 330) at a time. For example, the trigger controlled buffer 310 may be configured to initially provide the digital input signal only to the first triggering level 331, and then to provide the digital input signal only to the second triggering level 332 when the first triggering level 331 outputs a first level trigger, and so on, until the trigger controlled buffer 310 provides the digital input signal only to the $n^{th}$ triggering level 333 when the $n^{th}$-1 triggering level outputs a corresponding $n^{th}$-1 level trigger. In this manner, subsequent triggering levels (e.g., second triggering level 322, $n^{th}$ triggering level 333) receive the digital input signal and attempt to detect corresponding trigger conditions only as needed, which is useful when the trigger conditions of the subsequent triggering levels are relevant only when other trigger conditions of one or more previous triggering levels are met.

The triggering levels 331 to 333 and the trigger blocks 331-1 to 331-x, 332-1 to 332-y, and 333-1 to 333-z within the triggering levels 331 to 333 may be arranged to provide a complex triggering function that combines triggering functions of the configurable trigger blocks 331-1 to 331-x, 332-1 to 332-y, and 333-1 to 333-z in a manner desired by the user, thus enabling the user to effectively build any of a variety of customized complex triggering functions. That is, each of the first through $n^{th}$ triggering levels 331 to 333 is designed according to a corresponding logical expression realized through population and arrangement of the trigger blocks 331-1 to 331-x, 332-1 to 332-y, and 333-1 to 333-z, respectively. Accordingly, the first triggering level 331 implements a first logical expression, the second triggering level 332 implements a second logical expression, and the $n^{th}$ triggering level 333 implements an $n^{th}$ logical expression. The logical expressions are combined to provide the customized complex triggering function (according to an overall logical expression) for generating the complex trigger signal when the combined complex triggering conditions are detected.

An example of providing a customized complex triggering function using the multilevel triggering system 230 is provided below for purposes of illustration, and is otherwise not limiting of the scope of the present teachings. In this example, the first triggering level 331 includes trigger blocks 331-1 and 331-2, each of which is populated with a different triggering function (e.g., imported or copied from the trigger block library 350). The trigger controlled buffer 310 provides a first portion of the buffered input signal to the first triggering level 331, and the trigger blocks 331-1 and 331-2 output corresponding block triggers when they detect respective triggering conditions. The first triggering level 331 then generates and outputs the first level trigger in response to both block triggers being generated (the first logical expression embodied by the first triggering level 331 having been satisfied). This arrangement may embody a logical "AND" operation with respect to the trigger blocks 331-1 and 331-2.

In response to the first level trigger, the trigger controlled buffer 310 provides a second portion of the buffered input signal to the second triggering level 332, which is a different portion of the buffered input signal. In this example, the second triggering level 332 includes trigger blocks 332-1 and 332-2, each of which is populated with a different triggering function (e.g., imported or copied from the trigger block library 350). The trigger blocks 332-1 and 332-2 output corresponding block triggers when they detect respective triggering conditions in the second portion of the buffered input signal. The second triggering level 332 then generates and outputs the second level trigger in response to both block triggers being generated (the second logical expression embodied by the second triggering level 332 having been satisfied). Notably, in this example, the trigger blocks 332-1 and 332-2 do not receive any portion of the input signal, and therefore are not actively searching for the respective triggering conditions until after the first level trigger is generated.

In response to the second level trigger, the trigger controlled buffer 310 provides a third portion of the buffered input signal to the third (n=3) triggering level 333. In this example, the third triggering level 333 includes trigger blocks 333-1 and 333-2, each of which is populated with a different triggering function (e.g., imported or copied from the trigger block library 350). The trigger blocks 333-1 and 333-2 output corresponding block triggers when they detect respective triggering conditions in the third portion of the buffered input signal. The third triggering level 333 then generates and outputs the third level trigger in response to both block triggers being generated (the third logical expression embodied by the third triggering level 333 having been satisfied). Notably, in this example, the trigger blocks 333-1 and 333-2 do not receive any portion of the input signal, and therefore are not actively searching for the respective triggering conditions until after the first and second level triggers are generated.

In response to the first, second and third level triggers, the triggering matrix 330 generates and outputs the complex trigger signal (the overall logical expression having been satisfied). This arrangement may embody a logical "AND" operation with respect to the first, second and third level triggers. In response to the complex trigger signal, the trigger controlled buffer 310 outputs the detected signal, which corresponds to the third portion of the input signal, for example, in the depicted scenario.

Of course, as mentioned above, implementations of the various embodiments are not limited by the example. For instance, one or more of the first through third triggering levels 331 to 333 may receive the (same portion) of the buffered input signal from the trigger controlled buffer 310 simultaneously. In this case, the respective trigger blocks 331-1, 331-2, 332-1, 332-2 and 333-1, 333-2 actively search for their respective triggering conditions at substantially the same time. Likewise, one or more of the first through third triggering levels 331 to 333 may be configured to generate the respective first through third level triggers when either (rather than both) of the two trigger blocks 331-1, 331-2, 332-1, 332-2 and 333-1, 333-2 detects the corresponding triggering condition and generates the corresponding block trigger. This arrangement may embody a logical "OR" operation. Similarly, in the situation where the first through third triggering levels 331 to 333 simultaneously receive and process the input signal, the complex trigger signal may be generated in response to any one of the first through third level triggers being generated. Again, this arrangement may embody a logical "OR" operation among the first through third level triggers.

Accordingly, the user is able to design and implement any of a variety of complex triggering functions in order to generate a corresponding complex trigger signal. That is, the user is able to arrange the number and relationship of the different triggering levels. Also, within each triggering level, the user is able to arrange the type, number and relationship of trigger blocks. For example, the type of trigger block may be assigned by importing or copying a triggering function module (e.g., from the trigger block library 350) for populating the trigger block.

Figure 4:
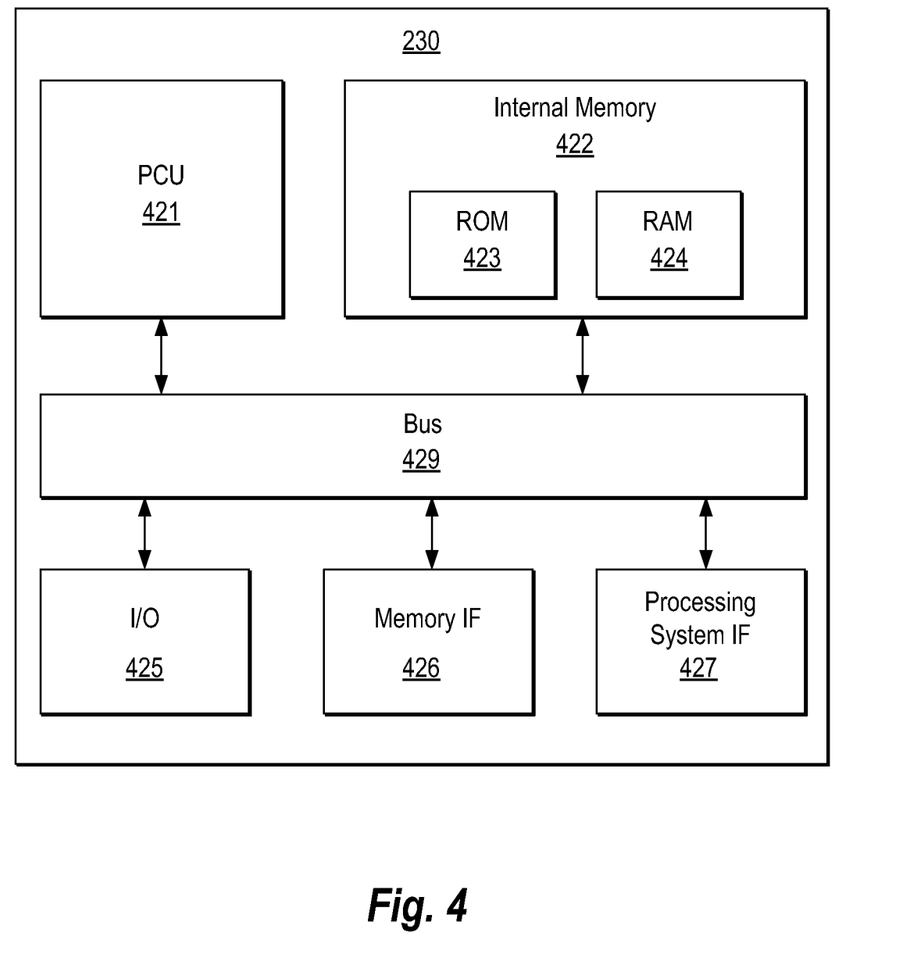
FIG. 4 is a block diagram of a multilevel triggering system implemented using a central processing unit (CPU), according to a representative embodiment.

FIG. 4 is block diagram illustrating an example of multilevel triggering system 230 implemented using a central processing unit (CPU), in which the functionality is implemented at least in part using software. In the depicted embodiment, the multilevel triggering system 230 includes CPU 421, internal memory 422, and various interfaces 425-427, which communicate with one another via bus 429. The CPU 421 is configured to execute one or more software algorithms of the embodiments described herein, including enabling building and execution of customized complex triggering functions via multiple triggering levels, trigger blocks and triggering function modules. In various embodiments, the CPU 421 may include its own memory (e.g., nonvolatile memory) for storing executable software code that allows it to perform various functions. Alternatively, the executable code may be stored in designated memory locations within internal memory 422. The CPU 421 may execute an operating system.

The internal memory 422 includes at least ROM 423 and RAM 424, although it is understood that the internal memory 422 may be implemented as any non-transitory computer readable medium including any number, type and combination of non-volatile and/or volatile memory. Further, the internal memory 422 may store program instructions, algorithms and results of calculations performed by the CPU 421.

In an embodiment, a user and/or other computers may interact with the multilevel triggering system 230 using various input device(s) through I/O interface 425. The input devices may include a keyboard, a track ball, a mouse, a touch pad or touch-sensitive display, and the like. Also, information may be displayed on a display through a display interface (not shown), which may include any type of graphical user interface (GUI). For example, visual representations of the triggering matrix 330 and/or the trigger block library 350 may be visually displayed, as well as features for building, testing or otherwise interacting with the same. The multilevel triggering system 230 also includes memory interface 426 for communicating with the memory 250 and processing system interface 427 for communicating with the signal processing system 240, as discussed above. For example, the multilevel triggering system 230 is able to communicate the detected signal to the signal processing system 240 via the processing system interface 427.

Figure 5:
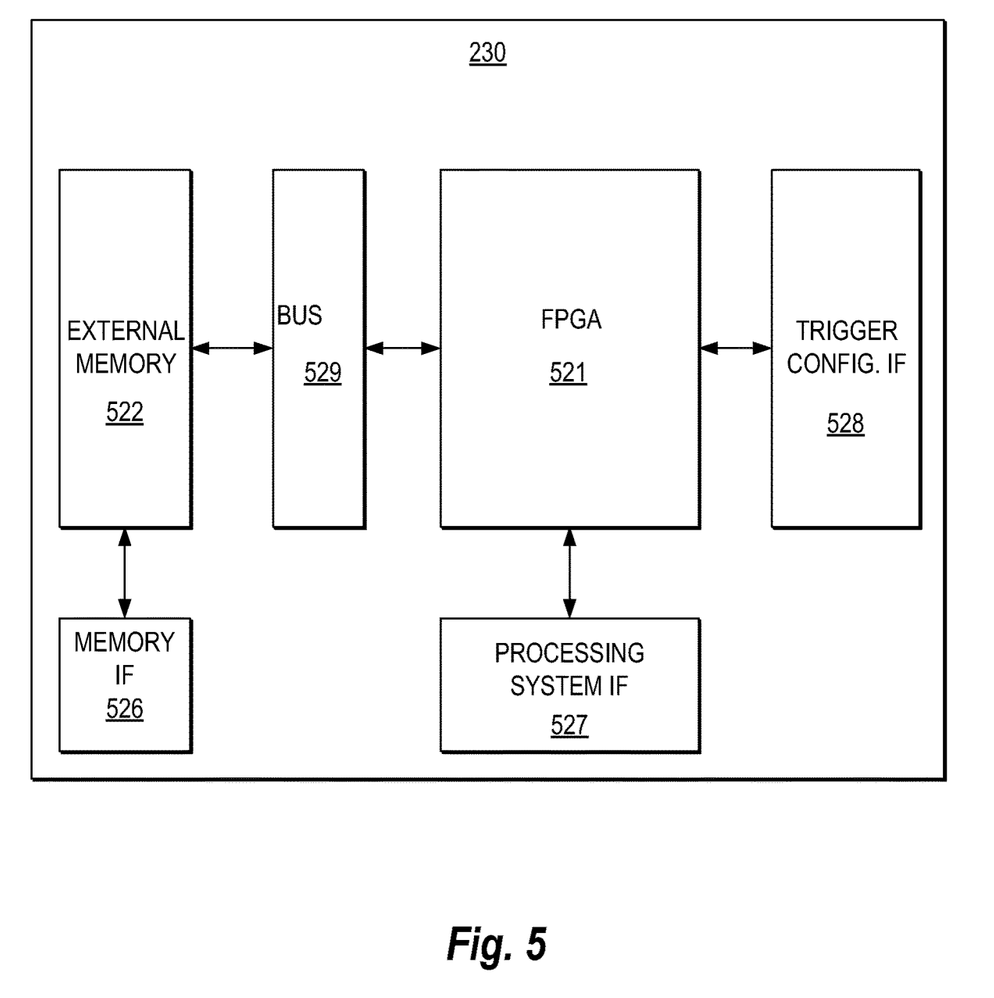
FIG. 5 is a block diagram of a multilevel triggering system implemented using a field-programmable gate array (FPGA), according to a representative embodiment.

FIG. 5 is block diagram illustrating an example of multilevel triggering system 230 implemented using a field-programmable gate array (FPGA), in which the functionality is implemented at least in part using hardware. In the depicted embodiment, the multilevel triggering system 230 includes FPGA 521, external memory 522, and various interfaces 526 to 528. The FPGA 521 communicates with the external memory 522 via bus 529.

The FPGA 521 includes multiple Intelligence Property (IP) cores configured to execute one or more hardware algorithms of the embodiments described herein, including enabling the building and execution of customized complex triggering functions via multiple triggering levels, trigger blocks and triggering function modules. For example, the triggering matrix 330 may be implemented in the FPGA 521 using the IP cores, where each IP core corresponds to one of the trigger blocks 331-1 to 331-x, 332-1 to 332-y, and 333-1 to 333-z, although other configurations are within the scope of the present teachings. In various embodiments, the FPGA 521 communicates with the external memory 522, which stores executable software code that programs the FPGA 521 to perform various functions and/or stores information from the FPGA 521. In various configurations, the external memory 522 may be the same as the memory 250, discussed above. The external memory 522 may be implemented as any non-transitory computer readable medium including any number, type and combination of non-volatile and/or volatile memory.

The multilevel triggering system 230 also includes memory interface 526 for communicating with the memory 250 and processing system interface 527 for communicating with the signal processing system 240, as discussed above. For example, the multilevel triggering system 230 is able to communicate the detected signal to the signal processing system 240 via the processing system interface 527. The multilevel triggering system 230 further includes trigger configuration interface 528, which enables the user and/or a computer to interact with and configure the FPGA 521 using various input device(s). For example, the structure of the triggering matrix 330 within the FPGA 521 may be configured through the trigger configuration interface 528.

The various "parts" shown in the multilevel triggering system 230 may be physically implemented using a software-controlled microprocessor, hard-wired logic circuits, or a combination thereof, as mentioned above. Also, while the parts are functionally segregated in the multilevel triggering system 230 for explanation purposes, they may be combined variously in any physical implementation. Further, one or more of the parts may be included in the signal processing system 240, or all or a portion of the corresponding functionalities may be implemented by the signal processing system 240. For example, the signal processing system 240 may include the I/O interface 425, such that input to and output from the multilevel triggering system 230 may occur via the signal processing system 240.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A multilevel triggering system of a signal analysis instrument for outputting a complex trigger signal, the system comprising:
   a trigger controlled buffer configured to receive and buffer an input signal;
   a plurality of triggering function modules, each triggering function module being configured to perform a corresponding triggering function for detecting a corresponding triggering condition; and
   a triggering matrix comprising a plurality of triggering levels configured to receive at least a portion of the buffered input signal from the trigger controlled buffer, each triggering level being configurable to include at least one trigger block and each trigger block being configurable to implement one of the plurality of triggering function modules, each trigger block generating a corresponding block trigger when the triggering condition of the corresponding triggering function module is detected in the received buffered input signal,
   wherein each triggering level of the plurality of triggering levels is configured to generate a corresponding level trigger when the at least one trigger block in the triggering level generates the corresponding block trigger, and
   wherein the triggering matrix is configured to generate the complex trigger signal when the plurality of triggering levels generate corresponding level triggers.

2. The system of claim 1, further comprising:
   a trigger block library configured to store the plurality of triggering function modules, the trigger block library being accessible by the triggering matrix for populating the at least one trigger block of each triggering level.

3. The system of claim 1, wherein each triggering level of the plurality of triggering levels is further configured to receive a different portion of the buffered input signal.

4. The system of claim 1, wherein a second triggering level of the plurality of triggering levels receives the buffered input signal only when a preceding first triggering level of the plurality of triggering levels generates a corresponding first level trigger.

5. The system of claim 4, wherein a third triggering level of the plurality of triggering levels receives the buffered input signal only when the second triggering level of the plurality of triggering levels generates a corresponding second level trigger.

6. The system of claim 1, wherein the plurality of triggering function modules have uniform input and output interfaces.

7. The system of claim 1, wherein at least one parameter of the triggering condition of each triggering function module is configurable by a user.

8. The system of claim 1, wherein the trigger controlled buffer comprises a first-in first-out (FIFO) buffer.

9. The system of claim 2, wherein each trigger block comprises a copy of one of the plurality of triggering modules from the trigger block library.

10. The system of claim 9, wherein the plurality of triggering function modules include at least two of a frequency mask triggering function, a power level triggering function, a time domain triggering function, a frequency shape triggering function, a time-frequency triggering function, and a modulation based triggering function.

11. A non-transitory computer readable medium storing software, executable by a processor, for multilevel triggering of a signal analysis instrument to output a complex trigger signal, the computer readable medium comprising:
   first level code including a plurality of first trigger blocks configurable to receive a first portion of a the buffered input signal and to implement a corresponding plurality of different triggering function modules for implementing different trigger functions responsive to corresponding triggering conditions, each first trigger block generating a corresponding first block trigger when the triggering conditions of the triggering function modules are detected in the first portion of the buffered input signal, and the first level code generating a corresponding first level trigger in accordance with a first logical expression incorporating the corresponding first block triggers generated by the first trigger blocks, respectively; and
   second level code including a plurality of second trigger blocks configurable to receive a second portion of the buffered input signal and to implement a corresponding plurality of different triggering function modules for implementing different trigger functions responsive to corresponding triggering conditions, each second trigger block generating a corresponding second block trigger when the triggering conditions of the triggering function modules are detected in the second portion of the buffered input signal, and the second level code generating a corresponding second level trigger in accordance with a second logical expression incorporating the corresponding second block triggers generated by the second trigger blocks, respectively,
   wherein the complex trigger signal is generated when the first and second level codes generate corresponding first and second level triggers, respectively.

12. The non-transitory computer readable medium of claim 11, wherein the input signal is buffered by a trigger controlled buffer in order to provide the first and second portions of the input signal to the first and second level codes, respectively.

13. The non-transitory computer readable medium of claim 11, further comprising:
   a trigger block library for storing the different triggering function modules, each triggering function module being configured to perform a corresponding triggering function for detecting a corresponding triggering condition,
   wherein the first and second trigger blocks are populated using the plurality of different triggering function modules from the trigger block library.

14. The non-transitory computer readable medium of claim 13, wherein the plurality of different triggering function modules include at least two of a frequency mask triggering function, a power level triggering function, a time domain triggering function, a frequency shape triggering function, a time-frequency triggering function, and a modulation based triggering function.

15. The non-transitory computer readable medium of claim 14, wherein the plurality of different triggering function modules have uniform input and output interfaces.

16. A signal analysis instrument comprising:
   a radio frequency (RF) downconverter configured to receive an RF input signal from a test device and to provide a downconverted analog input signal;
   an analog to digital converter (ADC) configured to convert the analog input signal to a digital input signal; and
   a triggering system configured to receive the digital input signal and to selectively output a complex trigger signal based on characteristics of the digital input signal, the triggering system comprising:
      a trigger controlled buffer configured to buffer the digital input signal and to selectively output a detected signal in response to the complex trigger signal;
      a trigger block library configured to store a plurality of triggering function modules, each triggering function module being configured to perform a corresponding triggering function for detecting a corresponding triggering condition; and
      a triggering matrix comprising a plurality of triggering levels configured to receive at least a portion of the buffered input signal from the trigger controlled buffer, each triggering level being configurable to include at least one trigger block and each trigger block being configurable to implement one of the plurality of triggering function modules from the trigger block library, each trigger block generating a corresponding block trigger when the triggering condition of the corresponding triggering function module is detected in the buffered input signal;
   wherein each triggering level of the plurality of triggering levels is configured to generate a corresponding level trigger when the at least one trigger block in the triggering level generates the corresponding block trigger, and
   wherein the triggering matrix is configured to generate the complex trigger signal when the plurality of triggering levels generate corresponding level triggers.

17. The signal analysis instrument of claim 16, further comprising:
   a processing system configured to analyze the detected signal output by the trigger controlled buffer in response to the complex trigger signal selectively output by the triggering system.

18. The signal analysis instrument of claim 16, wherein the triggering system comprises at least one field-programmable gate array (FPGA) configured to implement functionality of at least the triggering matrix.

19. The signal analysis instrument of claim 16, wherein the triggering system comprises at least one central processing unit (CPU) configured to implement functionality of at least the triggering matrix.

20. The signal analysis instrument of claim 1, wherein each triggering level of the plurality of triggering levels is further configured to receives a different portion of the buffered input signal from the trigger controlled buffer.

* * * * *